United States Patent [19]
Polinsky

[11] 3,959,025
[45] May 25, 1976

[54] METHOD OF MAKING AN INSULATED GATE FIELD EFFECT TRANSISTOR

[75] Inventor: Murray Arthur Polinsky, Somerville, N.J.

[73] Assignee: RCA Corporation, New York, N.Y.

[22] Filed: May 1, 1974

[21] Appl. No.: 465,892

[52] U.S. Cl. .................................. 148/1.5; 148/187; 357/91
[51] Int. Cl.² ........................................ H01L 21/265
[58] Field of Search ................ 148/1.5, 187; 357/91

[56] References Cited
UNITED STATES PATENTS

| | | | |
|---|---|---|---|
| 3,596,347 | 8/1971 | Beale et al. | 148/187 X |
| 3,597,667 | 8/1971 | Horn | 148/187 X |
| 3,615,934 | 10/1971 | Bower | 148/1.5 X |
| 3,638,300 | 2/1972 | Foxhall et al. | 148/1.5 X |
| 3,679,492 | 7/1972 | Fang et al. | 148/1.5 |
| 3,745,070 | 7/1973 | Yada et al. | 148/1.5 |
| 3,789,504 | 2/1974 | Jaddam | 148/187 X |

OTHER PUBLICATIONS
Kroell et al. "Production of Complementary IGFETs,"
IBM Tech. Discl. Bull., Vol. 15, No. 5, Oct. 1972, pp. 1623, 1624.

*Primary Examiner*—L. Dewayne Rutledge
*Assistant Examiner*—J. M. Davis
*Attorney, Agent, or Firm*—H. Christoffersen; Robert P. Williams; Thomas H. Magee

[57] ABSTRACT

An improved insulated gate field effect transistor is achieved by using a material such as silicon nitride as an ion implantation and oxidation mask overlying a channel region, forming source and drain regions or extensions thereof by implanting ions of a conductivity modifier into a semiconductor substrate, and subjecting the implanted ions to a drive-in diffusion whereby the conductivity modifier ions are redistributed. The ion implantation allows greater control over the amount of conductivity modifier implanted in the lightly doped source and drain regions, the more uniform distribution of conductivity modifier increases the source-drain breakdown voltage, while the use of the silicon nitride mask provides simultaneously for general alignment of the channel region with the effective gate length.

10 Claims, 9 Drawing Figures

METHOD OF MAKING AN INSULATED GATE FIELD EFFECT TRANSISTOR

This invention relates to an improved insulated gate field effect transistor having an increased source drain breakdown voltage and a method for making the transistor.

Insulated gate field effect transistors are well known in the art and their structure and operation have been described in various publications. One method of fabricating such devices is to form spaced source and drain regions of one type conductivity in a semiconductor substrate of opposite type conductivity by diffusing a conductivity modifier into the substrate from spaced blocks of doped insulating material, usually doped silane deposited silicon dioxide, which are formed on the surface of the substrate by conventional photolithographic techniques. This method has also been used to form lightly doped source and drain extensions which define the ends of a channel region and connect such a region to more heavily doped source and drain regions, the latter being usually formed in a diffusion furnace by conventional diffusion techniques. The more heavily doped source and drain regions insure good ohmic contact with source and drain electrodes and the lighter doped source and drain extensions improve the transistor's output resistance and source-drain breakdown voltage. One of the benefits of using doped oxide blocks is that such blocks can then be used as a mask in forming a relatively thin gate insulator and a gate electrode may be disposed on the gate insulator with portions thereof overlapping the relatively thicker doped oxide blocks. This reduces the undesirable capacitances of the overlapping portions of the gate electrode. Even though lateral diffusion of the conductivity modifiers under the gate structure does occur, substantial alignment of the channel region with the gate electrode does occur. In using the doped oxide method, it is difficult to control the exact amount of conductivity modifiers which diffuse into the substrate to form the lightly doped source and drain extensions. In addition, the thick oxide blocks overlying these regions contain doping impurities which may out-diffuse during subsequent processing steps and make it difficult to control the surface resistivity of the channel region.

Ion implantation has been used as a method to form source and drain regions and extensions thereof to U./S. Pat. No. 3,615,934 to Bower describes one method by which a so-called "self-aligned gate" transistor may be fabricated. An insulated gate electrode member disposed on a semiconductor substrate of one type conductivity is used as a mask by which ions of an opposite type conductivity modifier may be implanted selectively on both sides of the gate electrode member to form source and drain extensions which define the ends of a channel region lying beneath the gate electrode member. As a result of using the gate itself as the dopant mask, overlap of the gate metal and the source and drain regions is eliminated. This leads to a considerable reduction in the parasitic capacitance over that of transistors formed by the above doped oxide method, and thus improves high frequency operation. Also, the use of ion implantation results in improved control over the exact amount of conductivity modifiers which is implanted in the lightly doped souce and drain extensions, such amount affecting certain operating characteristics of the transistor.

One of the major differences in using ion implantation as compared to diffusion is the depth distribution of the implanted ions. A typical ion implanted depth distribution in a semiconductor substrate is approximately Gaussian in shape, with the mean depth lying just beneath the substrate's surface as compared to a diffused depth distribution where the mean depth of the more uniformly distributed conductivity modifiers lies further beneath the substrate's surface. Such an ion implanted distribution of conductivity modifiers is undesirable in certain transistor applications since the high concentration of modifiers beneath the surface and the relatively shallow PN junction give rise to an uneven field distribution. The result is that the point where the field strength is highest will break down first, and this will cause such a transistor to have a significantly reduced source-drain breakdown voltage.

IN THE DRAWINGS:

FIGS. 1, 2, 4, 5, 6, and 7 are a series of cross sections showing a succession of steps in the manufacture of the present improved transistor and illustrating the present improved method.

Figure 1:
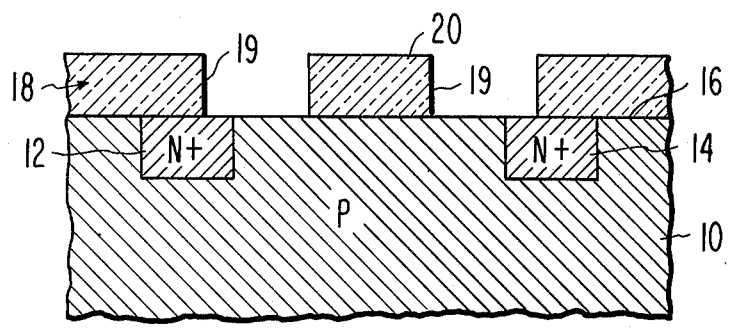
Figure 7:
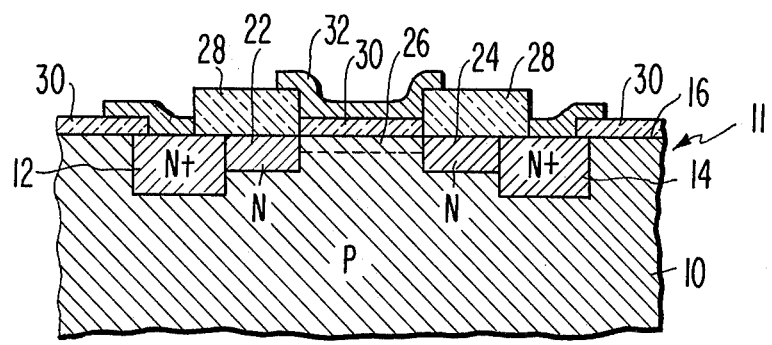

Referring now to FIG. 1 of the drawings, there is shown a substrate 10, such as a silicon wafer, which is used in making an improved transistor 11, shown in FIG. 7. The substrate 10 has an extrinsic conductivity of one type, P type shown in FIG. 1, and a resistivity typically between 1 and 25 ohm-cm. In a preferred embodiment, spaced source and drain regions 12 and 14, respectively, of an opposite type conductivity are formed in the substrate 10 adjacent to a surface 16 thereof by using a known conventional technique such as selectively diffusing dopant impurities through an oxide mask in a diffusion furnace. Such heavily doped regions 12 and 14 will insure sufficiently low sheet resistivity to provide good ohmic contact to subsequently formed source and drain electrodes. A layer 18 of material to be used as an ion implantation mask is formed on the surface 16 of the substrate 10. Such a layer 18 may be made of silicon nitride which is deposited on the surface 16 by pyrolytic decomposition of silane and ammonia at approximately 900°C. Windows 19 are etched in this layer 18 by using known photolithographic techniques exposing portions of the surface 16 beneath which source and drain extension are to be formed, by ion implantation in this example. As shown in FIG. 1, the windows are formed so that they overlap portions of the source and drain regions 12 and 14 while leaving a mask 20 over a portion of the surface 16 beneath which a channel region will be defined by the ends of the subsequently to be formed source and drain extensions.

Figure 2:
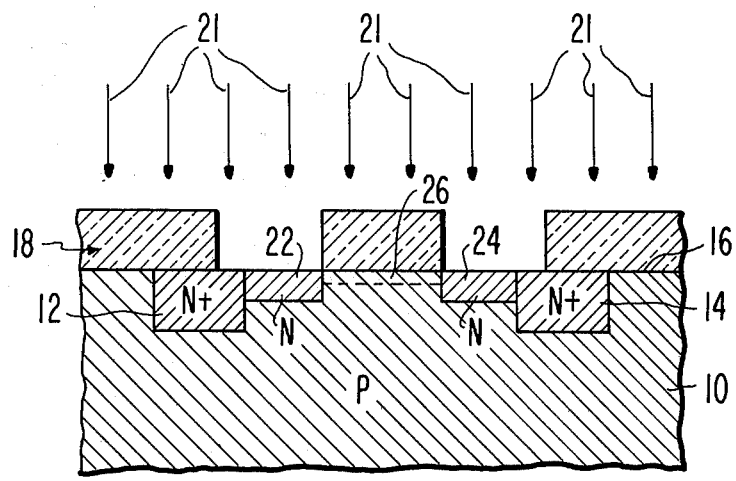
Figure 3:
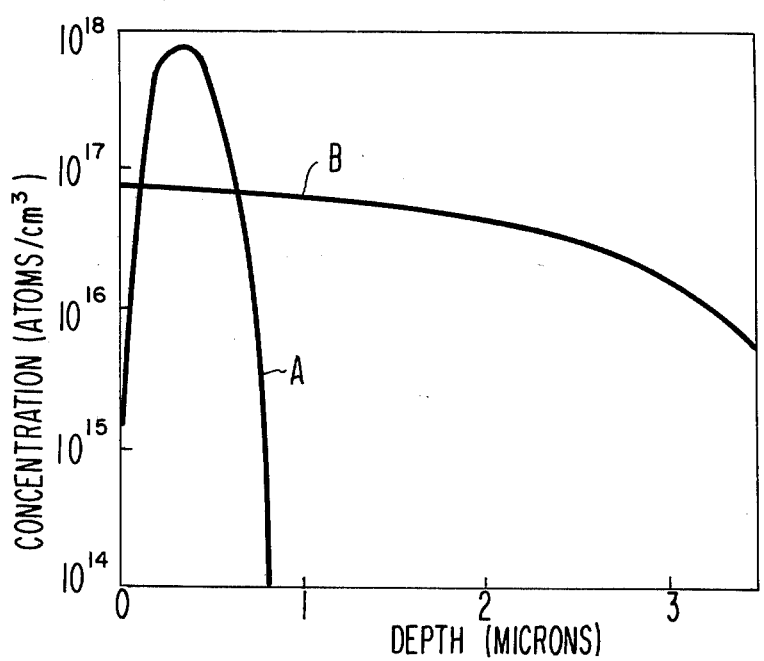
FIG. 3 is a diagram showing a pair of curves, illustrating a typical depth distribution of implanted ions before and after subjecting an ion implanted substrate to a drive in diffusion.

FIG. 2 diagramatically shows the ion implantation step of the present method. The surface 16 of the substrate 10 is bombarded with a beam of ions, illustrated by arrows 21 in FIG. 2, generated within a conventional ion implantation system which is not shown. The ions are of a conductivity modifier having the same type conductivity as that of the source and drain regions 12 and 14, which should be ions of a suitable donor such as phosphorus when the source and drain regions 12 and 14 are N+ type. The ion implantation is continued until lightly doped source and drain extensions 22 and 24 are formed in the substrate 10. The approximately Gaussian curve A FIG. 3 illustrates a typical depth distribution of implanted ions. The ends of the source and drain extensions 22 and 24 define a channel region 26. Although the embodiment illustrated uses the ion implantation step to form only the lightly doped source and drain extensions 22 and 24, such a step may be used to form entire source and drain regions and not merely extensions thereof.

Figure 4:
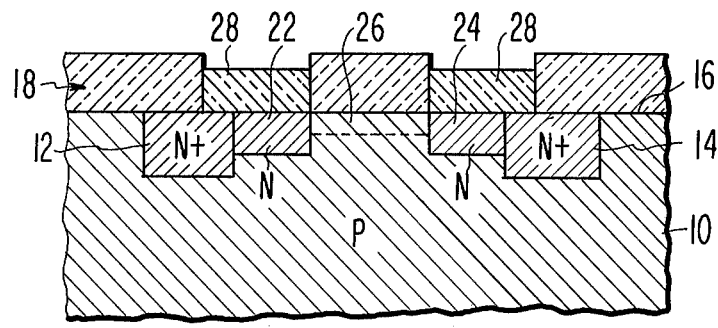

The substrate 10 is now heated to a temperature at which the implanted ions will diffuse into the substrate and in an atmosphere which will simultaneously allow a thick layer 28 of insulating material different from the material of the first layer 18 to form on the surface 16 exposed by the windows in the first layer 18. A different material is selected so that the first layer 18 can be removed by using an etchant which does not affect this second layer 28. FIG. 4 shows a thick layer 28 of silicon dioxide formed on the surface 16 by heating the substrate in an oxidizing atmosphere, such as steam, to a temperature of about 1100°C and maintaining the substrate 10 at this temperature for approximately 40 minutes. Such a drive-in diffusion redistributes the implanted ions so that a typical depth distribution of implanted ions now resembles a flatter curve B, as shown in FIG. 3. It will be understood that a thermal oxidation step of this kind consumes part of the material of the semiconductor substrate 10 so that each oxidation produces a new boundary within the semiconductor substrate 10. For convenience in illustration, however, the surface of regions over which a layer of oxide has been thermally grown, such as source and drain extensions 22 and 24, will always be designated as the surface 16 of the substrate 10. Although both the drive-in diffusion and formation of the layer 28 over the ion implanted regions were simultaneously performed in the present embodiment, each step may be performed separately if desired.

Figure 5:
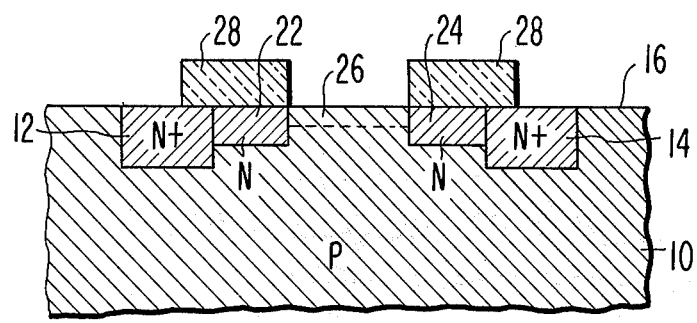

The first layer 18 of material is now removed by using an etchant which does not affect the second layer 28 of insulating material. An etchant of hot phosphoric acid can easily remove the layer 18 of silicon nitride without affecting the layer 28 of silicon dioxide. As illustrated by FIG. 5, removal of the layer 18 of silicon nitride exposes the surface 16 of the substrate 10 which overlies the channel region 26.

Figure 6:
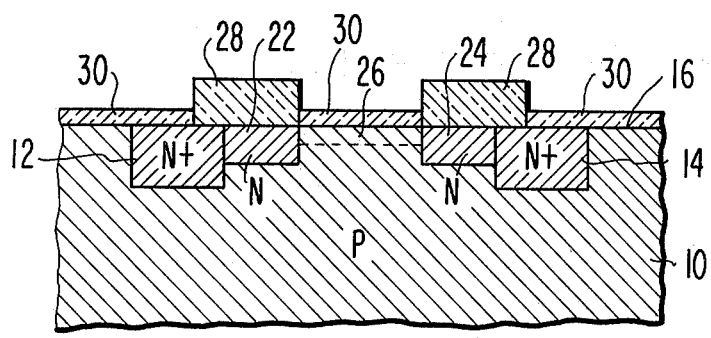

As shown in FIG. 6, a gate dielectric 30 comprising one or more thin layers of insulating material is now formed on the surface 16 of the substrate 10. In a preferred embodiment, the gate dielectric 30 comprises a single thin layer 30 which is formed preferably by thermally oxidizing a portion of the semiconductor substrate 10. A thin layer 30 of silicon dioxide may be formed on the surface 16 by heating the substrate 10 in an oxidizing atmosphere containing HCl, such as that formed by boiling a dilute solution of HCl and water, to a temperature of about 875°C for a period of about 1 hour. In a preferred embodiment, this oxide layer 30 is then subjected to an annealing step by heating the substrate 10 to a temperature of about 1000°C for a period of about 10 minutes in an inert or hydrogen containing atmosphere in order to reduce surface-state charge located at the surface 16 which overlies the channel region 26 and to reduce negative bias-temperature stress instability. See, for example, Hofstein "Stabilization of MOS Devices, Solid State Electronics, 1967, Vol. 10, pages 657–670, at page 662.

The present improved transistor 11, shown in FIG. 7, is completed by photolithographically defining contact openings in the oxide layer 30 over the source and drain regions 12 and 14, and then forming a gate electrode 32 and ohmic contacts to the source and drain regions 12 and 14 by conventionl metallization processes. ordinarily, the gate electrode is coextensive with the channel region 26. However, this design presents some fabrication difficulties with respect to alignment, so the gate electrode 32, in the present embodiment, is made longer than the channel region 26 to extend over parts of the thick oxide layer 28. The effective length of the gate electrode 32 is that part thereof which is closest to the channel region 26. See, for example, Heiman, U.S. Pat. No. 3,513,364, issued May 19, 1970. The effective length does not include the parts of the gate electrode 32 which extend over the thick oxide layer 26 where the substantially greater spacing between the gate electrode 32 and the path of current flow adds a negligible amount of additional capacitance to the transistor 11.

Figure 8:
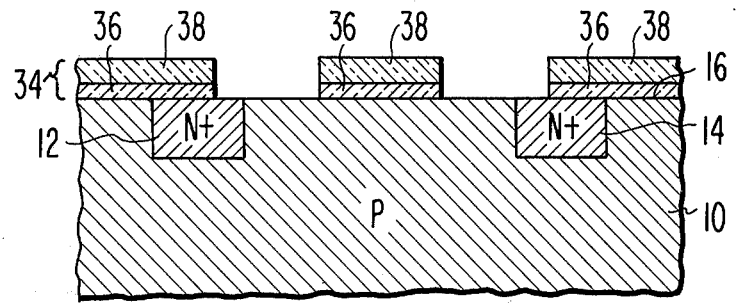
FIGS. 8 and 9 are cross-sectional views illustrating some of the steps in a second embodiment of the present invention.
Figure 9:
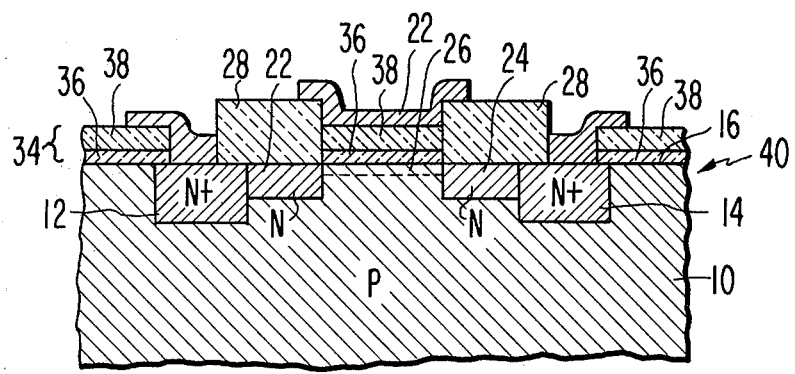

A second embodiment of the present invention, shown in FIGS. 8 and 9, may be practiced by substituting a multilayered structure 34 comprising more than one layer of material for the first layer 18 of material shown in FIG. 1. As shown in FIG. 8, such a structure may comprise a silicon dioxide layer 36 about 500A in thickness disposed on the surface 16 of the substrate 10 and then a silicon nitride layer 38 about 1000A in thickness disposed on the silicon dioxide layer 36. The same steps of the method as described above are then followed except that the multilayered structure 34 is left completely in place or only the exposed layer 38 of silicon nitride is removed with the remaining structure serving as the gate dielectric upon which the gate electrode 32 is formed. By leaving the multilayered structure 34 in place, a transistor 40, shown in FIG. 9, is formed which has the same structure as the above described transistor 11 with the single layer 30 of silicon dioxide replaced by the multilayered structure 34. If the exposed layer 38 of silicon nitride is removed, a transistor having the same structure as the transistor 11, shown in FIG. 7, is formed.

An advantage of the present method is that the drive-in diffusion redistributes the implanted ions from a high density Gaussian distribution with its maxiumum lying just beneath the surface 16 of the substrate 10 to a more uniform distribution throughout the source and drain extensions 22 and 24. Such a redistribution of conductivity modifiers produces a more even field distribution which gives the transistor 11 a higher source-drain breakdown voltage. Such a drive-in diffusion can not be successfully achieved in a "self-aligned gate" transistor where the gate electrode 32 is of a relatively non-refractory material, such as aluminum, because heating the substrate 10 with the gate electrode 32 in place to such a high temperature will cause a reaction between the gate electrode 32 and the gate dielectric 30 resulting in a reduced gate dielectric breakdown voltage. Also, such high temperature treatment after formation of ohmic contacts to the source and drain regions 12 and 14 may result in a possible shorting of the PN junctions in the transistor 11 due to the alloying of metal used for the ohmic contacts with silicon in the underlying source and drain regions 12 and 14.

The use of the thick oxide layer 26 provides for simultaneous alignment of the effective gate electrode with the channel region 26. The thickness of this oxide layer 28 is greater than the thickness of the gate dielectric 30 adjacent to the channel region 26, and this layer 28 contains no conductivity modifiers which may out diffuse during subsequent processing steps and make it difficult to control the surface resistivity of the channel region 26. The ion implantation step provides for accurate control over the amount of conductivity modifier in the source and drain extensions 22 and 24, and also reduces the extent of lateral diffusion of the conductivity modifier so that the effective gate length of the gate electrode 32 is generally coextensive with the length of the channel region 26. Although the embodiment described is an N channel transistor 11, the present invention is applicable to P channel as well as N channel transistors and in manufacturing both integrated and discrete metal-oxide-semiconductor transistors.

What is claimed is:

1. In a method of making an insulated gate field effect transistor wherein a mask is formed on a surface of a semiconductor substrate of one type conductivity and ions of an opposite type conductivity modifier are implanted beneath portions of said surface exposed by said mask whereby spaced source and drain regions of said opposite type conductivity or extensions thereof are formed while leaving a channel region between said source and drain regions, the improvement in said method comprising the steps of:

forming windows in a first layer of material on said surface with said windows exposing said portions of said surface whereby said mask is formed, bombarding said surface with said ions, heating said substrate to a temperature at which said ions will diffuse into said substrate, and maintaining said substrate at said temperature until a desired redistribution of said ions is achieved, forming a second layer of insulating material different from the material of said first layer on said surface exposed by said mask, removing said first layer from said surface whereby said surface overlying said channel region is exposed, forming a gate dielectric, comprising one or more layers of insulating material and being thinner than said second layer, on said surface overlying said channel region, and forming a gate electrode member on said gate dielectric whereby the effective gate length is registered with the length of said gate dielectric.

2. A method as recited in claim 1 wherein the material of said first layer is silicon nitride.

3. A method as recited in claim 1 wherein the insulating material of said second layer and said gate dielectric is silicon dioxide.

4. In a method of making an insulated gate field effect transistor wherein a mask is formed on a surface of a semiconductor substrate of one type conductivity and ions of an opposite type conductivity modifier are implanted beneath portions of said surface exposed by said mask whereby spaced source and drain regions of said opposite type conductivity or extensions thereof are formed while leaving a channel region between said source and drain regions, the improvement in said method comprising the steps of:

forming windows in a multilayered structure comprising a plurality of layers of material disposed on said surface with said windows exposing said portions of said surface whereby said mask is formed, bombarding said surface with said ions, heating said substrate to a temperature at which said ions will diffuse into said substrate, and maintaining said substrate at said temperature until a desired redistribution of said ions is achieved, forming a first layer of insulating material different from the material of at least one layer, including the exposed layer, of said multilayered structure on said surface exposed by said mask, removing at least one layer, including said exposed layer, of said multilayered structure, and forming a gate electrode member on the remaining portion of said multilayered structure whereby the effective gate length is registered with the length of said remaining portion of said structure.

5. A method as recited in claim 4 wherein the material of said exposed layer of said multilayered structure is silicon nitride.

6. A method as recited in claim 5 wherein said multilayered structure consists of two layers of material and the material of the layer of said structure adjacent to said surface is silicon dioxide.

7. A method as recited in claim 4 wherein the insulating material of said first layer is silicon dioxide.

8. In a method of making an insulated gate field effect transistor wherein a mask is formed on a surface of a semiconductor substrate of one type conductivity and ions of an opposite type conductivity modifier are implanted beneath portions of said surface exposed by said mask whereby spaced source and drain regions of said opposite type conductivity or extensions thereof are formed while leaving a channel region between said source and drain regions, the improvement in said method comprising the steps of:

forming windows in a multilayered structure comprising a plurality of layers of material disposed on said surface with said windows exposing said portions of said surface whereby said mask is formed, bombarding said surface with said ions, heating said substrate to a temperature at which said ions will diffuse into said substrate, and maintaining said substrate at said temperature until a desired redistribution of said ions is achieved, forming a first layer of insulating material on said surface exposed by said mask, and forming a gate electrode member on said multilayered structure at least on the portions of said structure overlying said channel region.

9. A method as recited in claim 8 wherein said multilayered structure consists of two layers of material, the material of the layer of said structure adjacent to said gate electrode member is silicon nitride, and the material of the layer of said structure adjacent to said surface is silicon dioxide.

10. A method as recited in claim 8 wherein the insulating material of said first layer is silicon dioxide.

* * * * *